(12) United States Patent
Kim et al.

(10) Patent No.: US 6,683,340 B2
(45) Date of Patent: Jan. 27, 2004

(54) SPLIT GATE FLASH MEMORY

(75) Inventors: Dong Jun Kim, Suwon (KR); Young Kyu Lee, Suwon (KR); Min Soo Cho, Sungnam (KR); Eui Youl Ryu, Youngin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/334,944

(22) Filed: Dec. 31, 2002

(65) Prior Publication Data

US 2003/0092234 A1 May 15, 2003

Related U.S. Application Data

(62) Division of application No. 09/954,769, filed on Sep. 18, 2001, now Pat. No. 6,524,915.

(30) Foreign Application Priority Data

Feb. 23, 2001 (KR) .......................................... 2001-9325

(51) Int. Cl.[7] .............................................. H01L 27/108
(52) U.S. Cl. ................................................. 257/300
(58) Field of Search .......................................... 257/300

(56) References Cited

U.S. PATENT DOCUMENTS

| | | | |
|---|---|---|---|
| 6,177,318 B1 * | 1/2001 | Ogura et al. ................ | 438/267 |
| 6,436,764 B1 * | 8/2002 | Hsieh ........................... | 438/257 |
| 6,504,207 B1 * | 1/2003 | Chen et al. .................. | 257/319 |
| 6,531,734 B1 * | 3/2003 | Wu ............................... | 257/315 |

* cited by examiner

Primary Examiner—David Nelms
Assistant Examiner—Thao Le
(74) Attorney, Agent, or Firm—Mills & Onello, LLP

(57) ABSTRACT

A split-gate flash memory includes a first gate insulating layer formed on a semiconductor substrate; a floating gate formed on the first gate insulating layer; a first spacer surrounding the floating gate and a side wall; a first junction region formed on a predetermined portion of the semiconductor substrate between two adjacent floating gates and having an opposite conductivity to that of the semiconductor substrate; a first conductive line formed on the first junction region between two adjacent first spacers; a second gate insulating layer formed on both a predetermined portion of the semiconductor substrate and the side wall of the first spacer; a word line formed on the second gate insulating layer, and having a vertical side wall and a uniform width; a second spacer formed on the vertical side wall of the word line; a second junction region formed on a portion of the semiconductor substrate adjacent the second spacer and having the same conductivity as the first junction region; an interlayer insulator formed over the whole surface of the semiconductor and having a contact hole, the contact hole formed on a portion of the second junction region; and a second conductive line formed on the interlayer insulator and contacting the second junction region through the contact hole.

14 Claims, 25 Drawing Sheets

SPLIT GATE FLASH MEMORY

This is a division of application Ser. No. 09/954,769 filed Sep. 18, 2001, now U.S. Pat. No. 6,524,915.

BACKGROUND OF THE INVENTION

1. Field of the Invention

The present invention relates to a split-gate flash memory and a method of manufacturing the same.

2. Description of Related Art

Recently split-gate flash memories have found wide use as data storage elements.

FIG. 1 is a top plan view illustrating a structure of a conventional split-gate flash memory. FIGS. 2A to 2J are cross-sectional views taken along line A–A' of FIG. 1, and FIGS. 3A to 3J are cross-sectional views taken along line B–B' of FIG. 1.

A method of manufacturing the conventional split-gate flash memory is now explained in detail with reference to FIGS. 1, 2A to 2J and 3A to 3J. Referring to FIGS. 2A and 3A, a first oxidation film 101 is formed on an active region of a semiconductor substrate 100. A first conductive layer 102 is provided on the first oxidation film 101 to form a field oxidation film 103 on a field region of the semiconductor substrate 100. Preferably, the field oxidation film 103 comprises polycrystalline silicon. The field oxidation film 103 may be formed, for example, using a local oxidation of silicon (LOCOS) process, a poly-buffered local oxidation of silicon (PBL) process, or a shallow-trench isolation (STI) process. The field oxidation film 103 of FIG. 3A is formed by the STI process.

In greater detail, the first oxidation film 101 and the first conductive layer 102 are sequentially deposited on the entire surface of the semiconductor substrate 100. A first nitride layer (not shown) is deposited on the first conductive layer 102. The first oxidation film 101, the first conductive layer 102 and the first nitride layer are patterned through a photolithography process to expose a portion of the semiconductor substrate corresponding to the field region. The exposed portion of the semiconductor substrate 100 is etched to form a trench (not shown). Thereafter, an oxidation film is deposited on the first nitride layer comprising the trench, and then a chemical-mechanical polish (CMP) process is performed until the first nitride layer is exposed. The oxidation film is then filled in the trench to form the field oxidation film 103. The first nitride layer remaining on the first conductive layer 102 is removed. After forming the field oxidation film 103, a second nitride layer 104 is deposited on the first conductive layer 102 and is patterned to expose a portion of the first conductive layer 102.

Referring to FIGS. 2B and 3B, a second oxidation film 105 is deposited over the whole surface of the semiconductor substrate 100 and covers the second nitride layer 104 and the exposed surface of the first conductive layer 102. Even though not shown, before depositing the second oxidation film 105, the first conductive layer 102 is etched using the second nitride layer 104 as a mask, or the exposed portion of the first conductive layer 102 is oxidized by an oxidation process, so that the exposed portion of the first conductive layer 102 is relatively thinner than the non-exposed portion thereof.

As shown in FIGS. 2C and 3C, the second oxidation film 105 is etched back to form an oxidation spacer 106 on a side wall of the second nitride layer 104. Then, using the oxidation spacer 106 as a mask, the exposed portions of the first oxidation film 101 and the first conductive layer 102, that are not covered with the oxidation spacer 106 and the second nitride layer 104, are etched to expose a corresponding portion of the semiconductor substrate 100. Using the oxidation spacer 106 and the second nitride layer 104 as a mask, impurities having a reverse conductivity to that of the semiconductor substrate 100 are ion-implanted into the exposed portion of the semiconductor substrate 100 to form a source junction region 107.

At this point, even though not shown, a side portion of the first conductive layer 102 is exposed while the first oxidation film 101 and the first conductive layer 102 are etched using the spacer 106 as a mask. In order to prevent a short circuit between the exposed side portion of the first conductive layer 102 and a source line that will be formed in a subsequent process, an oxidation film is deposited over the whole surface of the semiconductor substrate 100 by a chemical vapor deposition (CVD) technique and then is etched back to finally form the oxidation spacer 106 having a structure that surrounds the first conductive layer 102 as shown in FIG. 2C. Instead of the CVD process, a thermal oxidization process may be used to form the oxidation film.

Subsequently, as shown in FIGS. 2D and 3D, a second conductive layer is deposited over the whole surface of the semiconductor substrate 100 and is etched back to form the source line 109 that directly contacts the source junction region 107. At this point, the source line 109 is insulated from the first conductive layer 102 by the oxidation spacer 106.

As shown in FIGS. 2E and 3E, the second nitride layer 104 is selectively removed using, e.g., a phosphoric acid, and then the first oxidation film 101 and the first conductive layer 102 are etched using the oxidation spacer 106 as a mask to form a first gate insulating layer 110 and a floating gate 111.

As shown in FIGS. 2F and 3F, a third oxidation film 113 and a third conductive layer 114 are sequentially deposited over the whole surface of the semiconductor substrate 100. Preferably, the third conductive layer 114 is made of polycrystalline silicon. Thereafter, as shown in FIGS. 2G and 3G, the third oxidation film 113 and the third conductive layer 114 are simultaneously etched back to form a second gate insulating layer 115 and the word line 116 on a side wall of the oxidation spacer 106.

Subsequently, as shown FIGS. 2H and 3H, a fourth oxidation film and a third nitride layer are deposited over the whole surface of the semiconductor substrate 100 and then are etched back to form a buffer layer 117 and a spacer 118 on a side wall of the word line 116 and to expose a portion of the semiconductor substrate 100 corresponding to a drain junction region that will be formed in a subsequent process. Preferably, the spacer 118 comprises nitride.

As shown in FIGS. 2I and 3I, impurities having the same conductivity as that of the source junction region are ion-implanted into the exposed portion of the semiconductor substrate 100 using a mask (not shown) for an ion implantation to form the drain junction region 119.

Subsequently, as shown in FIGS. 2J and 3J, silicide layers 120 are formed on the source line 109, the drain junction region 119 and the word line 116 through a silicidation process. An interlayer insulator 121 is formed over the whole surface of the semiconductor substrate 100 and a contact hole 122 is formed to expose the drain region 119. The interlayer insulator 121 includes a contact hole 122 formed at a portion of the drain junction region 119. Finally, a metal line 123 is formed on the interlayer insulator 121 to contact the drain junction region 119 through the contract hole 122. Therefore, the conventional split-gate flash memory is completed.

A programming operation and an erasing operation of the conventional split-gate flash memory are explained below.

First, a programming operation of the conventional split-gate flash memory is as follows. As shown in FIG. 4A, a high voltage VDD is applied to the source junction region 107 through the source line 109, and a low voltage 0V is applied to the drain junction region 119. Electrons generated from the drain junction region 119 move toward the source junction region 107 through a channel region that is weakly inverted by a threshold voltage Vth applied to the word line 116. The electrons moving toward the source junction region 107 are excited due to a potential difference between the drain junction region 119 and the floating gate 111 in which a capacitance coupling occurs as a result of the high voltage applied to the source line 109 and then are injected into the floating gate 111. That is, a programming operation is performed by hot carrier injection to the floating gate 111.

Meanwhile, an erasing operation of the conventional split-gate flash memory is as follows. As shown in FIG. 4B, a high voltage VDD is applied to the word line 116, and a low voltage 0V is applied to the source and drain junction regions 107 and 119, so that electrons accumulated in the floating gate 111 causes Fowler-Nordheim (F-N) tunneling to the word line 116 and thus are erased from the floating gate 111.

However, the conventional split-gate flash memory has problems in that the resistance of the word line 116 can increase and in that a short circuit may occur between the word line 116 and the drain junction region 119. This is explained in detail with reference to FIGS. 5A to 5D.

First, as shown in FIG. 5A, when the third conductive layer made of polycrystalline silicon is deposited and patterned, the third conductive layer can become over-etched, and therefore the resulting word line 116a is not completely formed, whereby the height of the word line 116a is lower than expected. As a result, the cross-sectional area of the word line 116a is relatively smaller and, therefore, the resistance of the word line is increased.

Also, as the height of the word line 116a is lowered, when a nitride layer 118a is later deposited and etched back as shown in FIG. 5B, a spacer 118b is formed on a side surface of the word line 116a, and portions of leftover nitride 130 are remain on the word line 116a as well, as shown in FIG. 5C. In addition, the spacer 118b formed on the side surface of the word line 116a becomes relatively smaller in area.

Therefore, as shown in FIG. 5D, when the silicide layers 120 are formed on the word line 116a and the drain junction region 119 through the silicidation process, since the nitride spacer 118b cannot sufficiently insulate the word line 116a and the drain junction region 119, a short circuit between the word line 116a and the drain junction region 119 may occur.

In addition, due to the portions of leftover nitride 130 remaining on the word line 116a, the area of the silicide layer 120 formed on the word line 116a becomes reduced, and, consequently, the resistance of the word line 116a becomes increased.

SUMMARY OF THE INVENTION

To overcome the limitations described above, it is an object of the present invention to provide a split-gate flash memory in which the word line resistance is relatively small.

It is another object of the present invention to provide a split-gate flash memory in which a short circuit between a drain junction region and a word line is mitigated or eliminated.

In order to achieve the above object, the preferred embodiments of the present invention provide a split-gate flash memory. The split-gate flash memory includes a first gate insulating layer formed on a semiconductor substrate; a floating gate formed on the first gate insulating layer; a first spacer surrounding the floating gate and having an outer side wall; a first junction region formed on a predetermined portion of the semiconductor substrate between two adjacent floating gates and having a reverse conductivity to that of the semiconductor substrate; a first conductive line formed on the first junction region between two adjacent first spacers; a second gate insulating layer formed on both a predetermined portion of the semiconductor substrate and the side wall of the first spacer; a word line formed on the second gate insulating layer, and having a vertical side wall and a uniform width; a second spacer formed on the vertical side wall of the word line; a second junction region formed on a portion of the semiconductor substrate adjacent the second spacer and having the same conductivity as the first junction region; an interlayer insulator formed over the whole surface of the semiconductor and having a contact hole, the contact hole formed on a portion of the second junction region; and a second conductive line formed on the interlayer insulator and contacting the second junction region through the contact hole.

In another aspect, the present invention provides a split-gate flash memory, comprising: a first gate insulating layer formed on a semiconductor susbtrate; a floating gate formed on the first gate insulating layer; a first spacer surrounding the floating gate and a side wall; a first junction region formed on a predetermined portion of the semiconductor substrate between two adjacent floating gates and having a reverse conductivity to that of the semiconductor substrate; a first conductive line formed on the first junction region between two adjacent first spacers; a second gate insulating layer formed on both a predetermiend portion of the semiconductor substrate and the side wall of the first spacer; a word line formed on the second gate insulating layer, having a vertical side wall and overlapping an end portion of the first spacer; a second spacer formed on the vertical side wall of the word line; a second junction region formed on a portion of the semiconductor substrate adjacent the second spacer and having the same conductivity as the first junction region; an interlayer insulator formed over the whole surface of the semiconductor and having a contact hole, the contact hole formed on a portion of the second junction region; and a second conductive line formed on the interlayer insulator and contacting the second junction region through the contact hole.

In yet another aspect, the present invention provides a method of manufacturing a split-gate flash memory. The method includes forming an array substrate including: a) a first gate insulating layer formed on a semiconductor susbtrate; b) a floating gate formed on the first gate insulating layer; c) a first spacer surrounding the floating gate and a side wall; d) a first junction region formed on a predetermined portion of the semiconductor substrate between two adjacent floating gates and having a reverse conductivity to that of the semiconductor substrate; and e) a first conductive line formed on the first junction region between the two adjacent first spacers; depositing sequentially a first insulating layer, a first conductive layer and a second insulating layer over the whole surface of the semiconductor substrate; etching the first conductive layer and the second insulating layer to a predetermined thickness to expose the first conductive line, a portion of the first conductive layer; forming a third insulating layer on the exposed conductive line and the exposed portion of the first conductive layer; removing the second insulating layer to expose a portion of the first conductive layer under the second insulating layer; etching simultaneously the first insulating layer and the first conductive layer using the second insulating layer as a mask to form a second gate insulating layer and a word line, the word line having a vertical side wall; forming a second spacer on the vertical wall of the word line; ion-implanting impurities having the same conductivity as the first junction region into the exposed portion of the semiconductor substrate to form a second junction region, the second junction region overlapping the second spacer; forming an interlayer insulating layer over the whole surface of the semiconductor substrate, the interlayer insulating layer having a contact holeformed on a portion of the second junction region; and forming a second condutive line on the interlayer insulator, the second conductive line contacting the second junction region through the contact hole.

In another embodiment, the present invention provides a method of manufacturing a split-gate flash memory. The method includes forming an array substrate including: a) a first gate insulating layer formed on a semiconductor substrate; b) a floating gate formed on the first gate insulating layer; c) a first spacer surrounding the floating gate and having a side wall; d) a first junction region formed on a predetermined portion of the semiconductor substrate between two adjacent floating gates and having a reverse conductivity to the semiconductor substrate; and e) a first conductive line formed on the first junction region between two adjacent first spacers; forming sequentially a first insulating layer, a first conductive layer and a second insulating layer over the whole surface of the semiconductor substrate; etching the second insulating layer and the first conductive layer in a predetermined thickness to expose a portion of the first conductive layer; forming a third insulating layer on the exposed portion of the first conductive layer; removing the remaining second insulating layer to expose a portion of the first conductive layer under the remaining second insulating layer; etching the first conductive layer and the first insulating layer using the third insulating layer as a mask; removing the third insulating layer; patterning the first conductive layer and the first insulating layer to form a word line and a second gate insulating layer, the word line having a vertical side wall; forming a second spacer on the vertical side wall; ion-implanting impurities having the same conductivity as the first conductive line into the exposed portion of the semiconductor substrate to form a second junction region, the scond junction region overlapping the second spacer; forming an interlayer insulator over the whole surface of the semiconductor substrate, the interlayer insulating layer having a contact holeformed on a portion of the second junction region; and forming a second condutive line on the interlayer insulator, the second conductive line contacting the second junction region through the contact hole.

The split-gate flash memory according to the preferred embodiments of the present invention offers a number of advantages. Since the word line includes the vertical side wall and has a uniform width, increase in resistance of the word line due to area size reduction of the word line is prevented. Also, since the nitride spacer is formed only on a side wall of the word line, the nitride layer does not remain on the word line. Moreover, a short circuit between the drain junction region and the word line is prevented due to the nitride spacer.

BRIEF DESCRIPTION OF THE DRAWINGS

For a more complete understanding of the present invention and the advantages thereof, reference is now made to the following description taken in conjunction with the accompanying drawings, in which like reference numerals denote like parts, and in which.

DETAILED DESCRIPTION OF PREFFERED EMBODIMENTS

Reference is now made in detail to preferred embodiments of the present invention, examples of which are illustrated in the accompanying drawings.

FIGS. 6A to 6O and 7A to 7O are cross-sectional views showing a process of manufacturing a split-gate flash memory according to a first preferred embodiment of the present invention.

Figure 1:
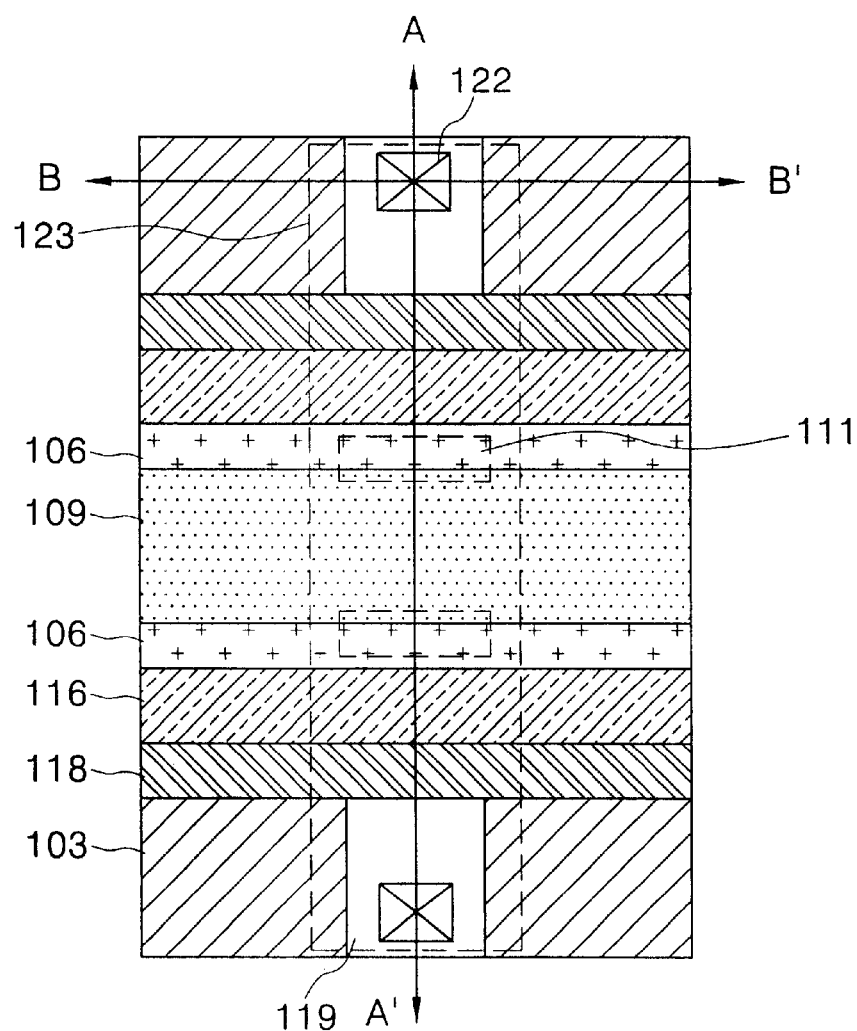
FIG. 1 is a top plan view illustrating a structure of a conventional split-gate flash memory.
Figure 2A:
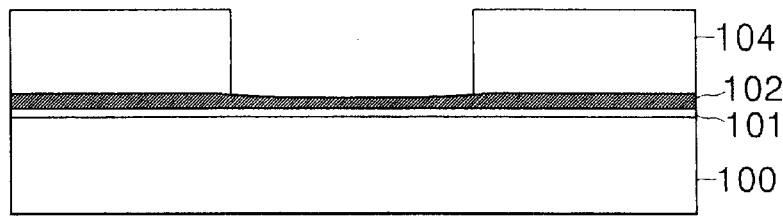
FIGS. 2A to 2J are cross-sectional views taken along line A–A' of FIG. 1.
Figure 2B:
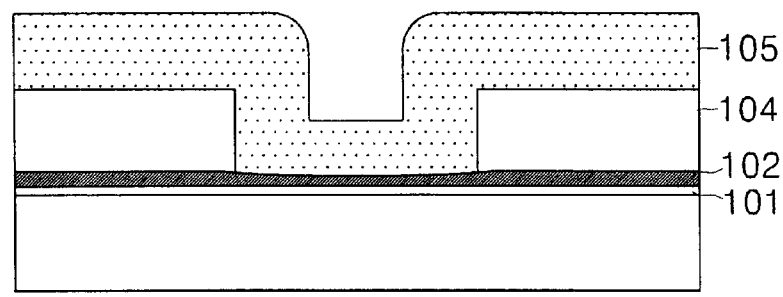
Figure 2C:
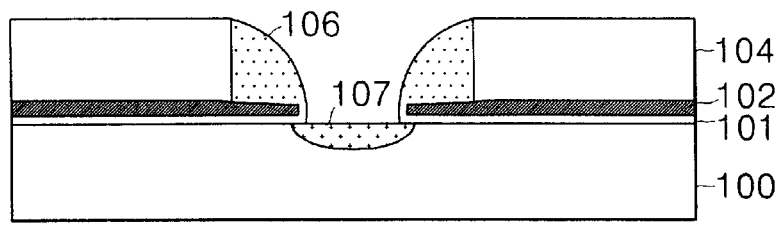
Figure 2D:
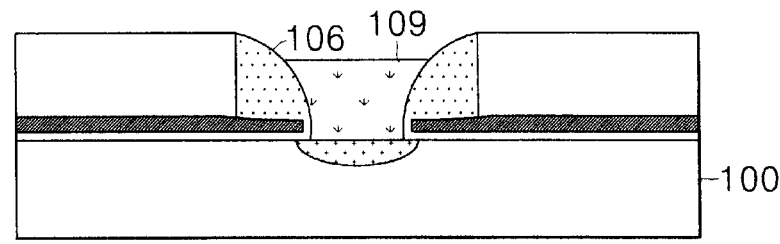
Figure 2E:
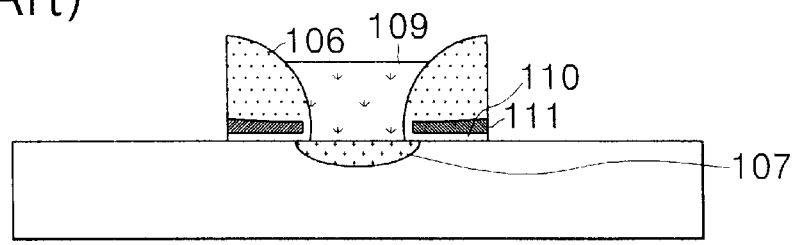
Figure 2F:
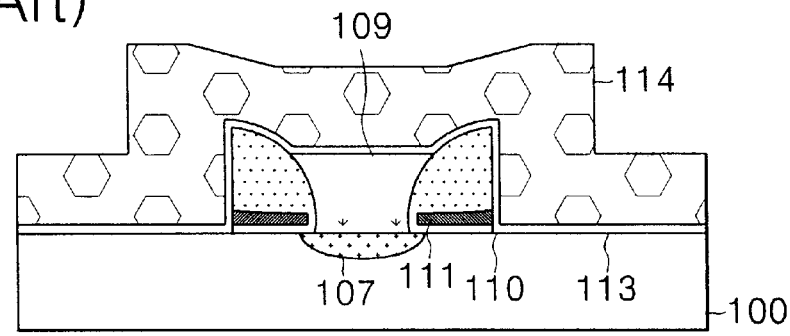
Figure 2G:
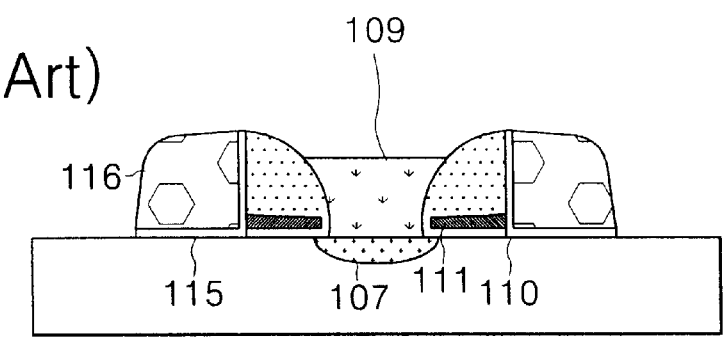
Figure 2H:
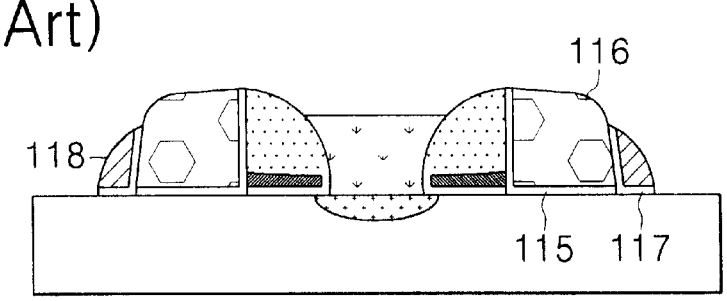
Figure 2I:
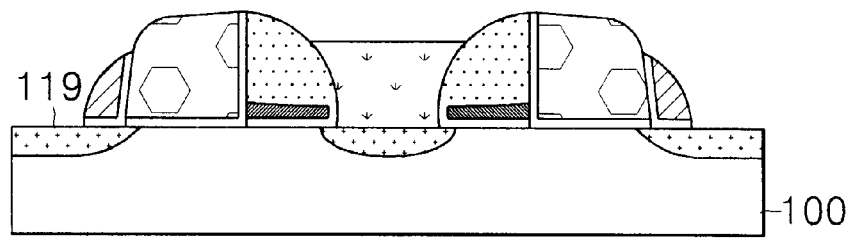
Figure 2J:
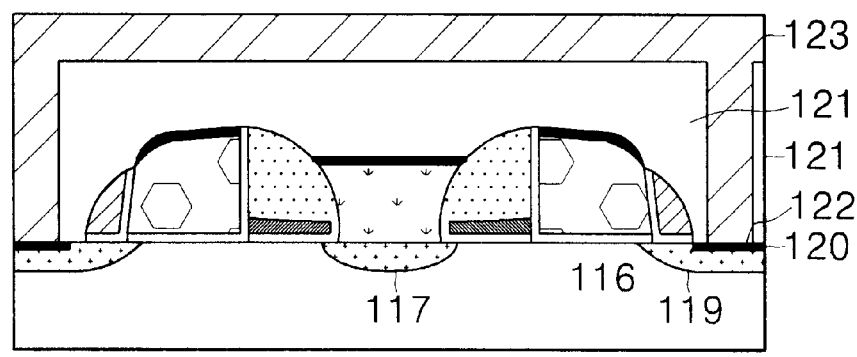
Figure 3A:
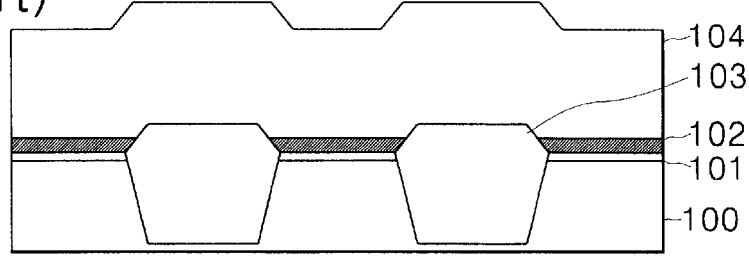
FIGS. 3A to 3J are cross-sectional views taken along line B–B' of FIG. 1.
Figure 3B:
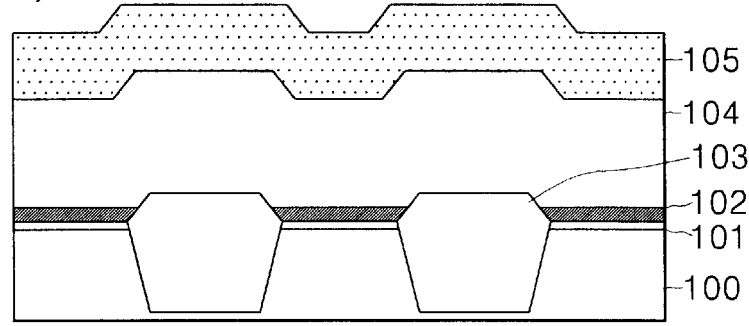
Figure 3C:
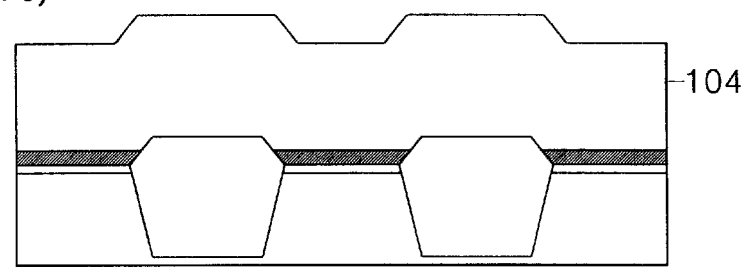
Figure 3D:
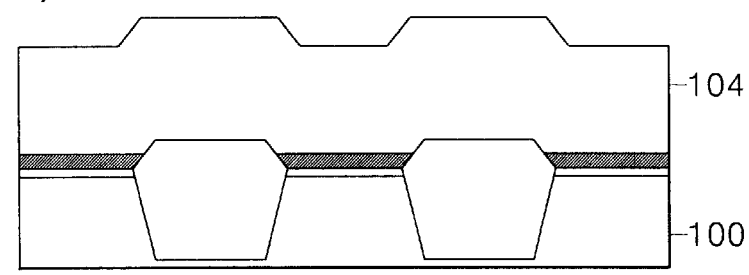
Figure 3E:
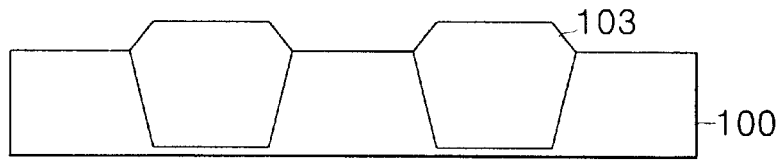
Figure 3F:
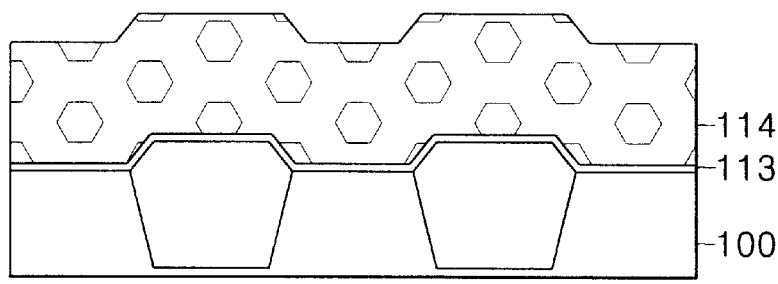
Figure 3G:
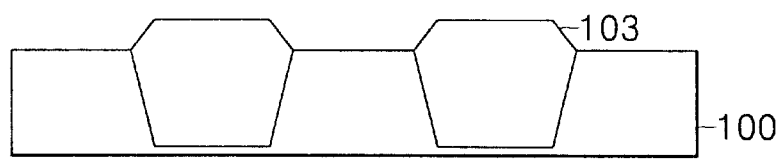
Figure 3H:
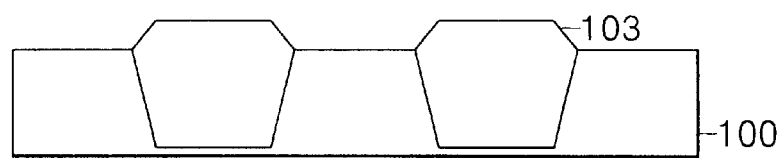
Figure 3I:
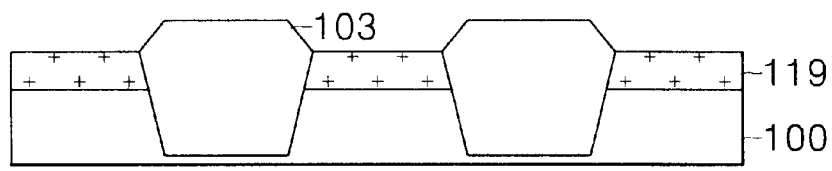
Figure 3J:
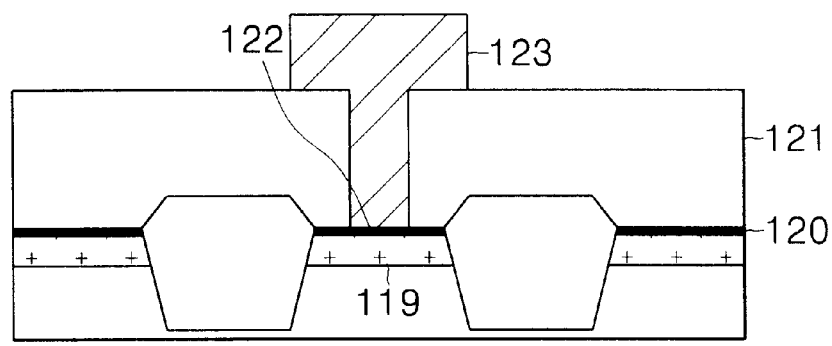
Figure 4A:
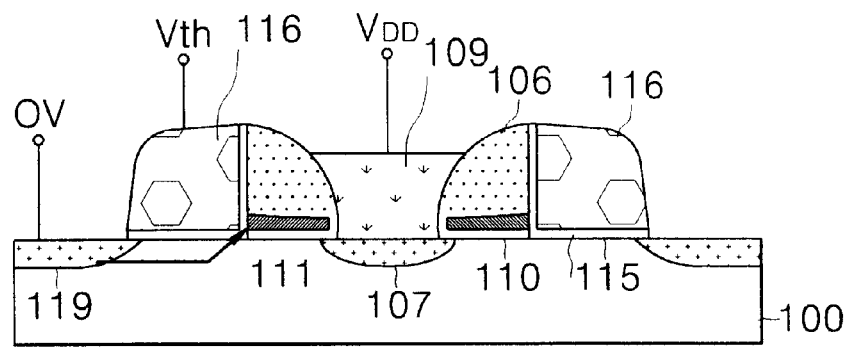
FIG. 4A is a cross-sectional view illustrating a programming operation of the conventional split-gate flash memory.
Figure 4B:
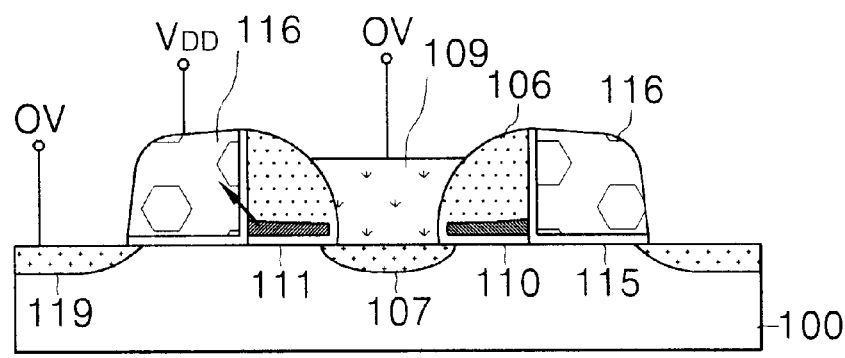
FIG. 4B is a cross-sectional view illustrating an erasing operation of the conventional split-gate flash memory.
Figure 5A:
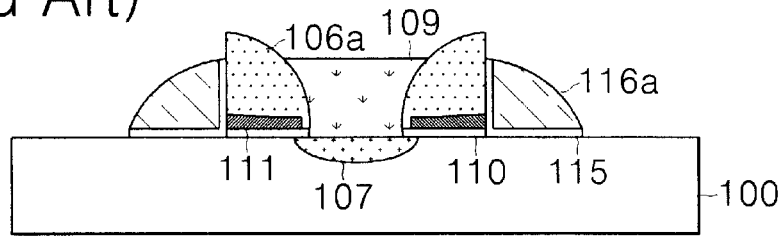
FIGS. 5A to 5D are cross-sectional views illustrating problems associated with the conventional split-gate flash memory.
Figure 5B:
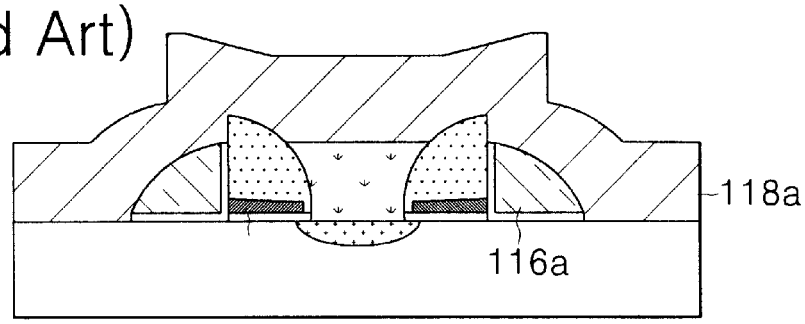
Figure 5C:
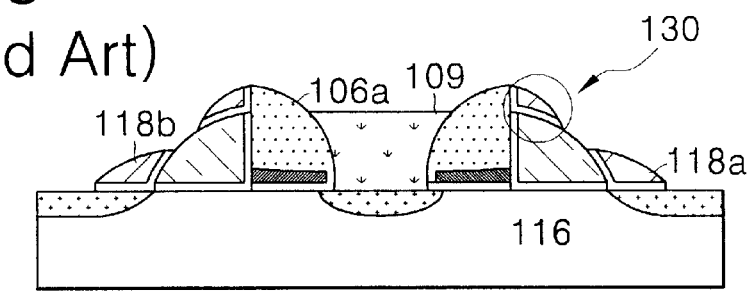
Figure 5D:
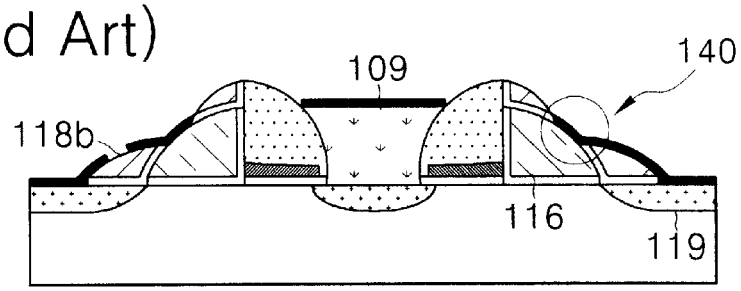
Figure 6A:
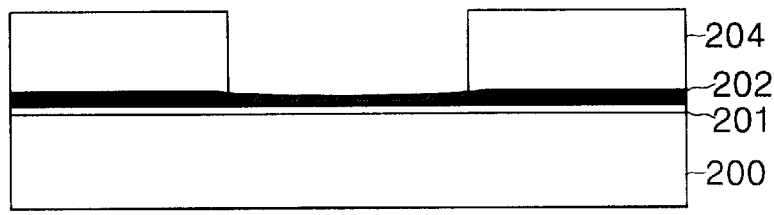
FIGS. 6A to 6O and 7A to 7O are cross-sectional views showing a process of manufacturing a split-gate flash memory according to a first preferred embodiment of the present invention.
Figure 6B:
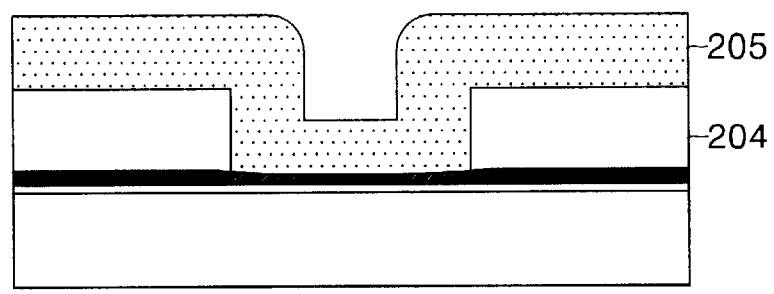
Figure 6C:
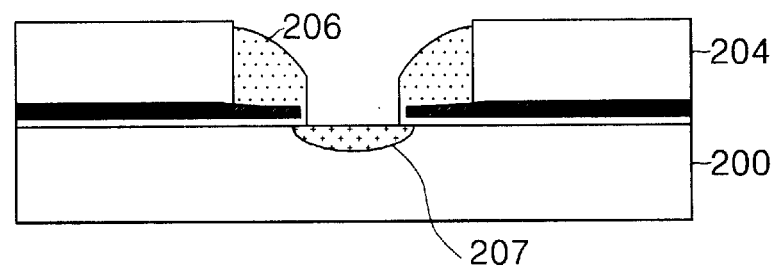
Figure 6D:
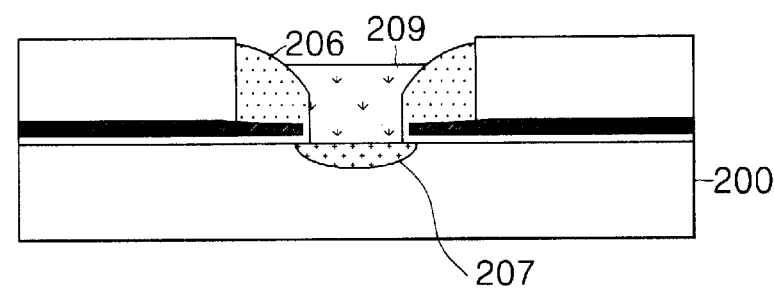
Figure 6E:
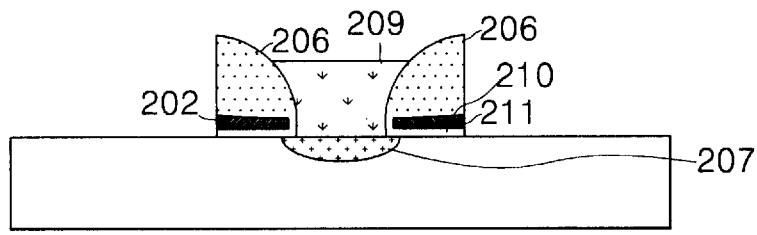
Figure 6F:
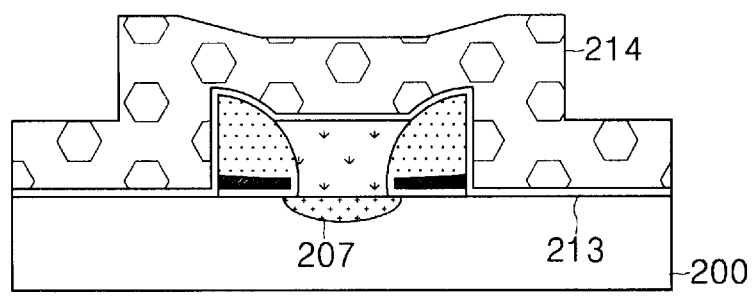
Figure 6G:
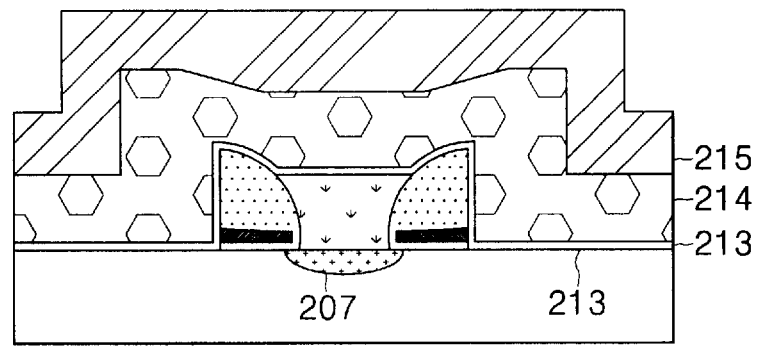
Figure 6H:
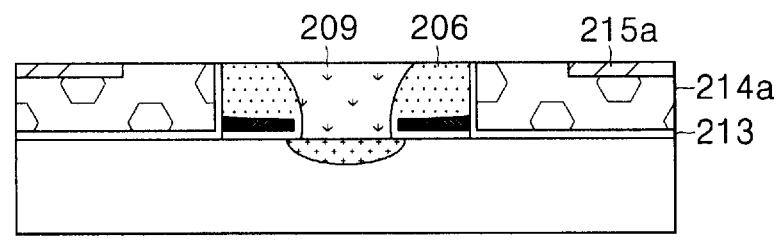
Figure 6I:
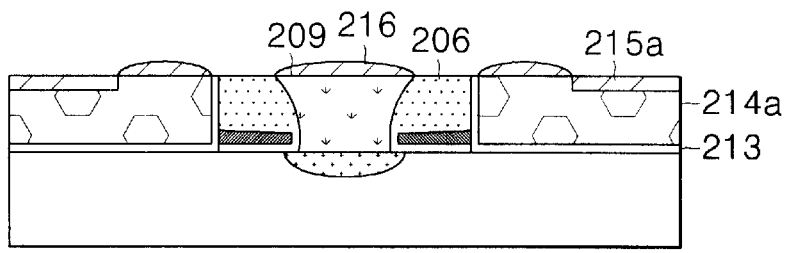
Figure 6J:
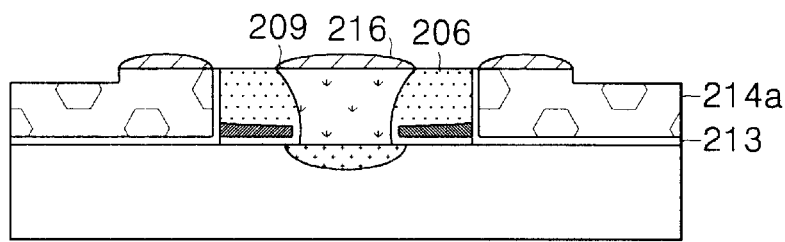
Figure 6K:
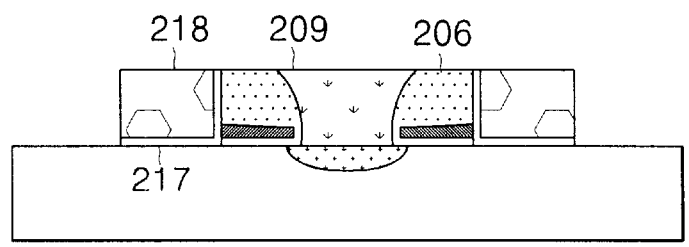
Figure 6L:
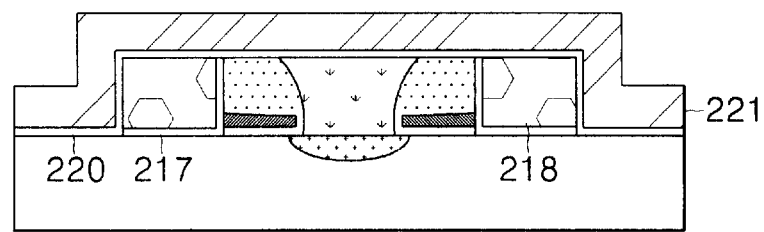
Figure 6M:
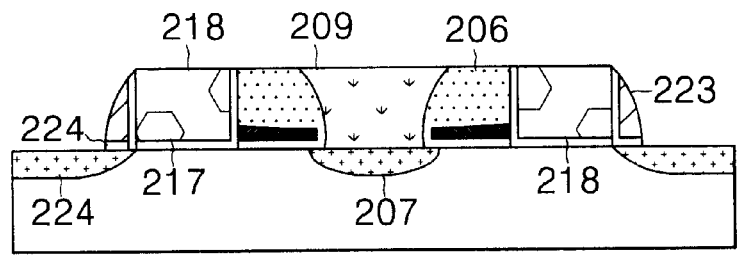
Figure 6N:
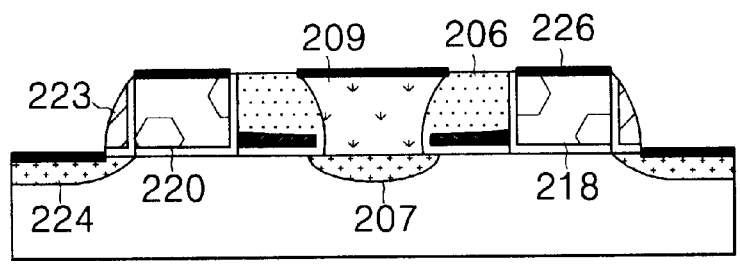
Figure 6O:
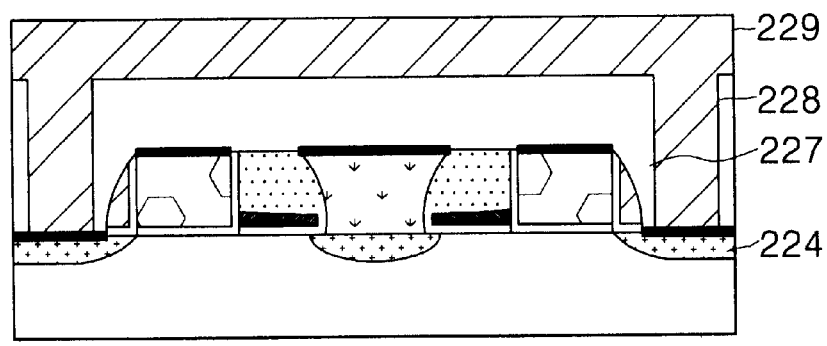
Figure 7A:
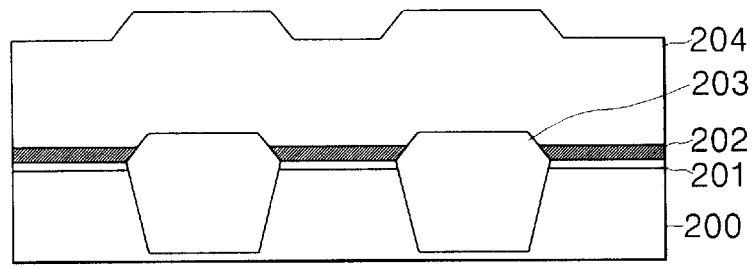
Figure 7B:
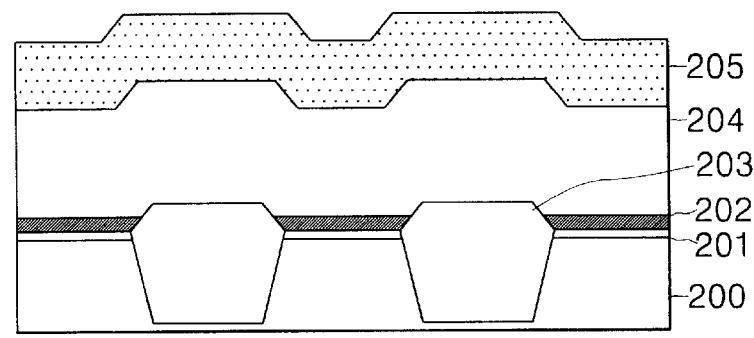
Figure 7C:
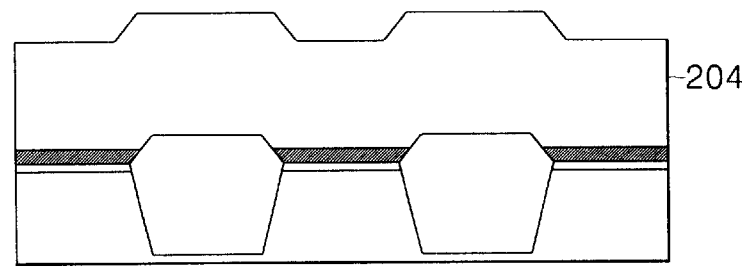
Figure 7D:
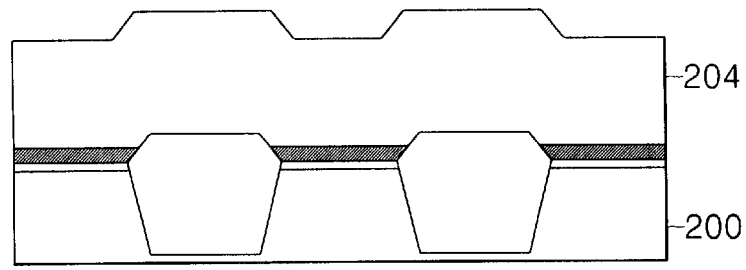
Figure 7E:
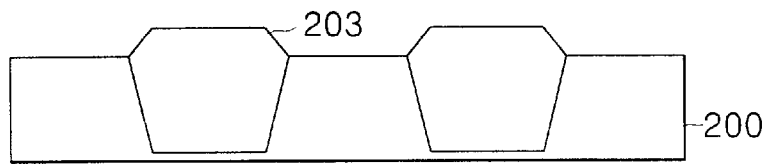
Figure 7F:
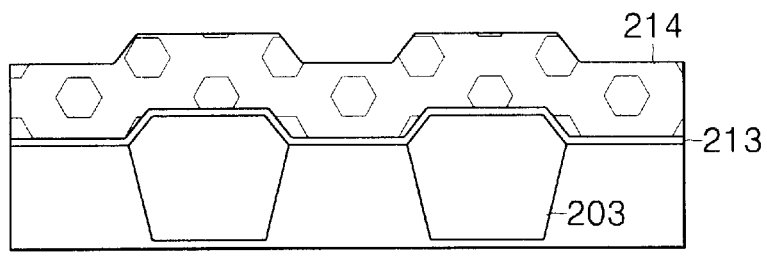
Figure 7G:
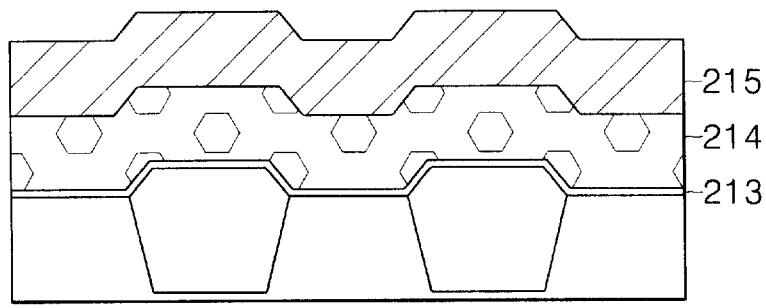
Figure 7H:
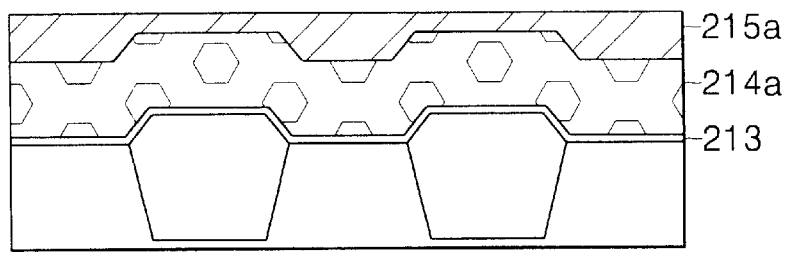
Figure 7I:
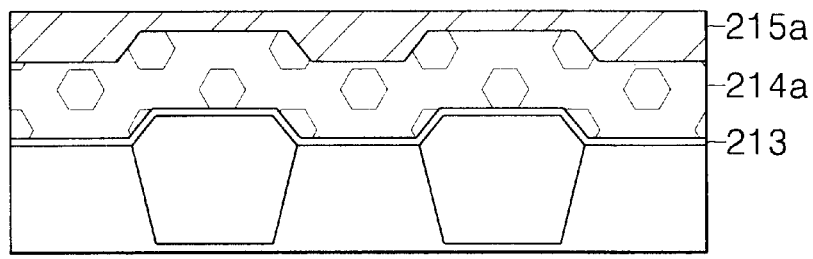
Figure 7J:
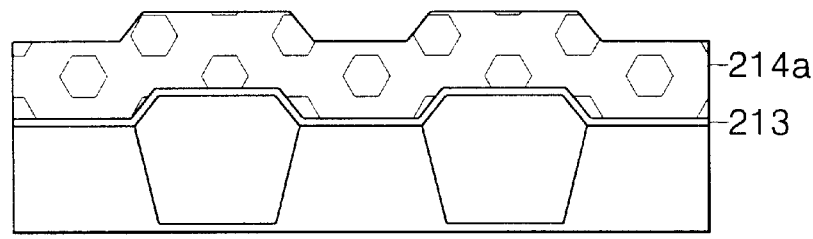
Figure 7K:
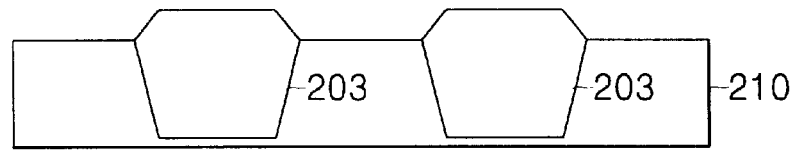
Figure 7L:
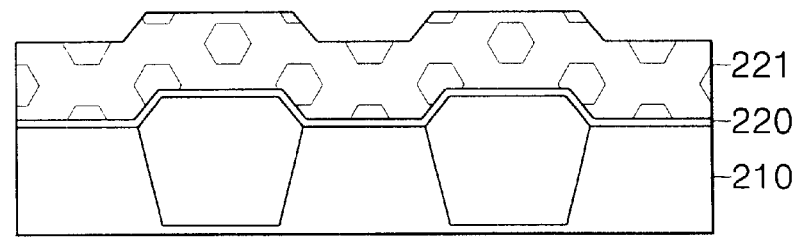
Figure 7M:
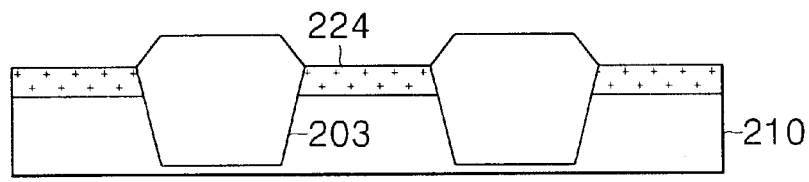
Figure 7N:
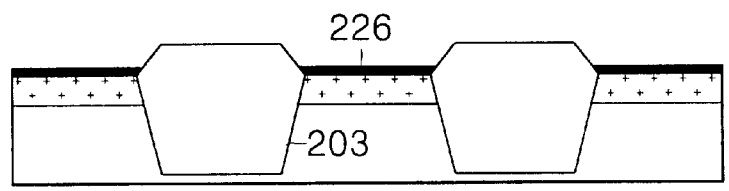
Figure 7O:
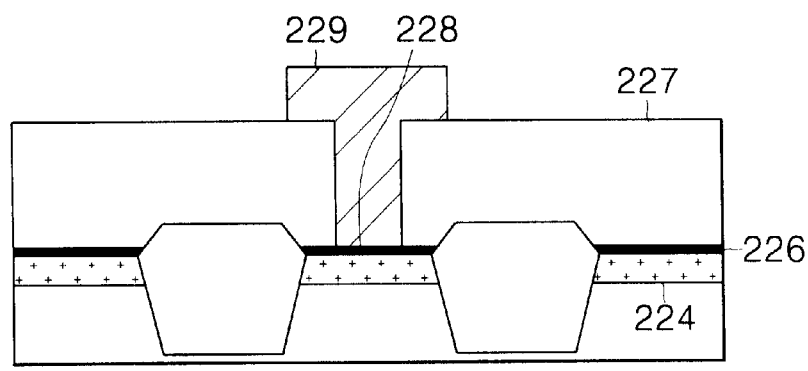

The split-gate flash memory according to the first preferred embodiment of the present invention has the same plan structure as that of FIG. 1, and FIGS. 6A to 6O are cross-sectional views taken along line A–A' of FIG. 1, and FIGS. 7A to 7O are cross-sectional views taken along line B–B' of FIG. 1.

The process of FIGS. 6A to 6E and 7A to 7E is the same as that of FIGS. 2A to 2E and 3A to 3E.

First, as shown in FIGS. 6A and 7A, a first oxidation film 201 is formed on an active region of a semiconductor substrate 200. A first conductive layer 202 is on the first oxidation film 201 to form a field oxidation film 203 on a field region of the semiconductor substrate 200. Preferably, the field oxidation film 203 is made of polycrystalline silicon. The field oxidation film 203 may be formed by a local oxidation of silicon (LOCOS) process, a poly-buffered LOCOS (PBL) process, or a shallow-trench isolation (STI) process. The field oxidation film 203 of FIG. 6A is formed by the STI process, for the purpose of the present discussion.

A first nitride layer (not shown) is deposited on the first conductive layer 202. The first oxidation film 201, the first conductive layer 202 and the first nitride layer are patterned through a photolithography process to expose a portion of the semiconductor substrate corresponding to the filed region. The exposed portion of the semiconductor substrate 200 is etched to form a trench (not shown). Thereafter, an oxidation film is deposited on the trench and the first nitride layer, and then a chemical-mechanical polish (CMP) process is performed until the first nitride layer is exposed, and then the oxidation film is filled in the trench to form the field oxidation film 203. The first nitride layer remaining on the first conductive layer 202 is removed. After forming the field oxidation film 203, a second nitride layer 204 is deposited on the first conductive layer 202 and is patterned to expose a portion of the first conductive layer 202.

Referring to FIGS. 6B and 7B, a second oxidation film 205 is deposited over the entire surface of the semiconductor substrate 200 and covers the second nitride layer 204 and the exposed surface of the first conductive layer 202. Even though not shown, before depositing the second oxidation film 205, the first conductive layer 202 is etched using the second nitride layer 204 as a mask, or the exposed portion of the first conductive layer 202 is oxidized by an oxidation process, so that the exposed portion of the first conductive layer 202 is relatively thinner than the non-exposed portion thereof.

As shown in FIGS. 6C and 7C, the second oxidation film 205 is etched back to form a spacer 206 on a side wall of the second nitride layer 204. The spacer 206 is preferably made of oxide. Then, using the spacer 206 as a mask, the exposed portions of the first oxidation film 201 and the first conductive layer 202, which are not covered with the spacer 206 and the second nitride layer 204, are etched to expose a corresponding portion of the semiconductor substrate 200. Using the spacer 206 and the second nitride layer 204 as a mask, impurities having an opposite conductivity to that of the semiconductor substrate 200 are ion-implanted into the exposed portion of the semiconductor substrate 200 to form a source junction region 207.

At this point, even though not shown, a side portion of the first conductive layer 202 is exposed while the first oxidation film 201 and the first conductive layer 202 are etched. In order to prevent a short circuit between the exposed side portion of the first conductive layer 202 and a source line that will be formed in a subsequent process, an oxidation film is deposited over the whole surface of the semiconductor substrate 200 by a chemical vapor deposition (CVD) technique and then is etched back to finally form the spacer 206 having a structure that surrounds the first conductive layer 202 as shown in FIG. 6C. Instead of the CVD process, a thermal oxidization process may be used to form the oxidation film.

Subsequently, as shown in FIGS. 6D and 7D, a second conductive layer is deposited over the whole surface of the semiconductor substrate 200 and is etched back to form the source line 209 that directly contacts the source junction region 207. At this point, the source line 209 is insulated from the first conductive layer 202 by the oxidation spacer 206.

As shown in FIGS. 6E and 7E, the second nitride layer 204 is selectively removed using, e.g., a phosphoric acid, and then the first oxidation film 201 and the first conductive layer 202 are etched using the spacer 206 as a mask to form a first gate insulating layer 210 and a floating gate 211.

Subsequently, as shown in FIGS. 6F and 7F, a third oxidation film 213 and a third conductive layer 214 are deposited over the entire surface of the semiconductor substrate 200. Preferably, the third conductive layer 214 comprises polycrystalline silicon. The third oxidation film 213 is deposited through a CVD process or a thermal oxidation process.

Next, as shown in FIGS. 6G and 7G, a third nitride layer 215 is deposited on the third conductive layer 214.

Thereafter, as shown in FIGS. 6H and 7H, an array substrate including the third conductive layer 214 and the third nitride layer 215 is etched through the CMP process until the source line 209 is exposed, so that the array substrate is planarized. At this point, instead of the third nitride layer 215, a SiON layer may be deposited on the third conductive layer 214, and thereafter the CMP process may be performed.

As shown in FIGS. 6I and 7I, an oxidation process is performed using a nitride layer portion 215a remaining after the CMP process as an oxidation mask to oxidize an exposed portion of the source line 209 and an exposed portion of the third conductive layer 214a to selectively form a fourth oxidation film 216.

As shown in FIGS. 6J and 7J, the nitride layer portion 215a is removed by a wet-etching technique to expose a portion of the underlying third conductive layer 214a.

Subsequently, as shown in FIGS. 6K and 7K, using the fourth oxidation film 216 as a mask, the third conductive layer 214a is etched to form a word line 218. Instead of a sloped, or gentle, side wall, the word line has a vertical side wall and thus is of a uniform width.

As shown in FIGS. 6L and 7L, a fifth oxidation film 220 and a fourth nitride layer 221 are sequentially deposited and then are etched back to form a nitride spacer 223 on a side wall of the word line 218 (see FIG. 6M).

As shown in FIGS. 6M and 7M, using a mask (not shown) for an ion implantation, impurities having the same conductivity as the source junction region 207 are ion-implanted into the exposed portion of the semiconductor substrate 200 to form a drain junction region 224.

As shown in FIGS. 6N and 7N, silicide layers 226 are formed on the source line 207, the drain junction region 224 and the word line 218.

As shown in FIGS. 6O and 7O, an interlayer insulator 227 is formed over the whole surface of the semiconductor substrate 200. The interlayer insulator 227 includes a contact hole 228 on a portion of the drain junction region 224. A metal layer is deposited and patterned to form a metal line 229. The metal line 229 contacts the drain junction region 224 through the contact hole 228. Therefore, the split-gate flash memory according to the first preferred embodiment of the present invention is completed.

The split-gate flash memory according to the first preferred embodiment of the present invention has the following advantages. Since the word line has a vertical side wall and, therefore, a uniform width, as opposed to the word line of the conventional split-gate flash memory, any reduction in area size of the word line is mitigated or eliminated, and thus any variance in resistance of the word line as a result of inconsistencies in the fabrication process can be prevented. In addition, since the word line has a vertical side wall, the nitride layer spacer 223 can sufficiently insulate the word line 218 and the drain junction region 224, whereby a short circuit between the word line 218 and the drain junction region 224 is avoided. Because the nitride remainders are removed to a sufficient degree, the silicide layers 226 come to have a sufficient area size, and thus the contact resistance of the word line can be reduced.

FIGS. 8A to 8O and 9A to 9O are cross-sectional view showing a process of manufacturing a split-gate flash memory according to a second preferred embodiment of the present invention.

Figure 8A:
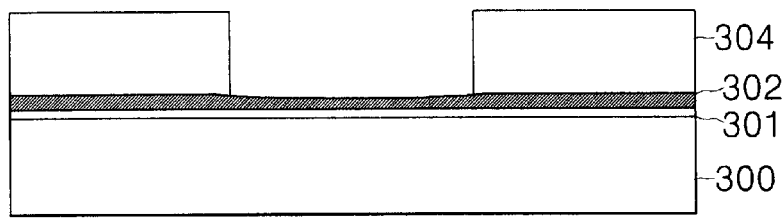
FIGS. 8A to 8O and 9A to 9O are cross-sectional view showing a process of manufacturing a split-gate flash memory according to a second preferred embodiment of the present invention.
Figure 8B:
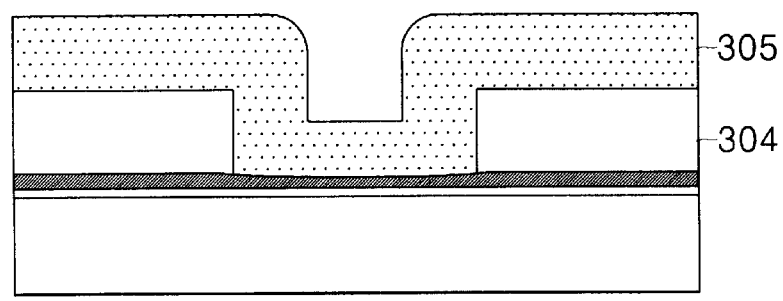
Figure 8C:
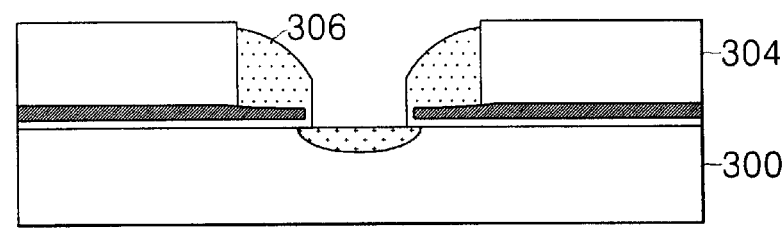
Figure 8D:
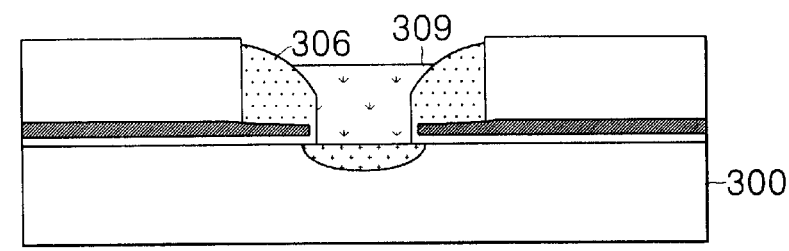
Figure 8E:
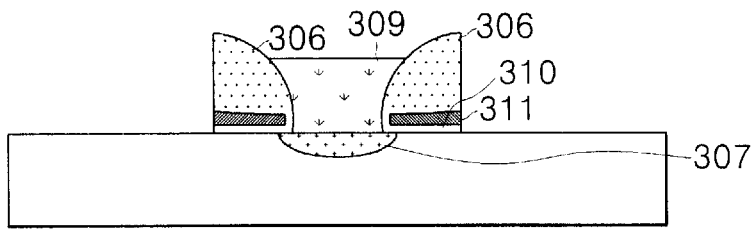
Figure 8F:
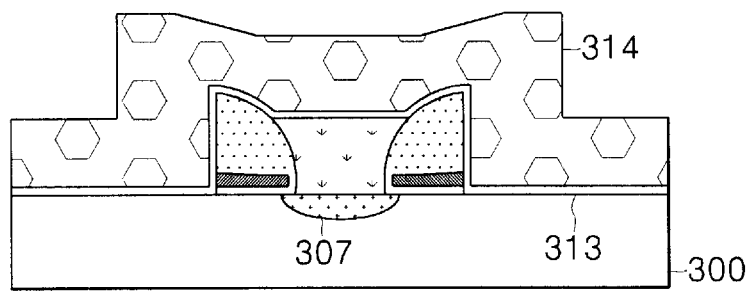
Figure 8G:
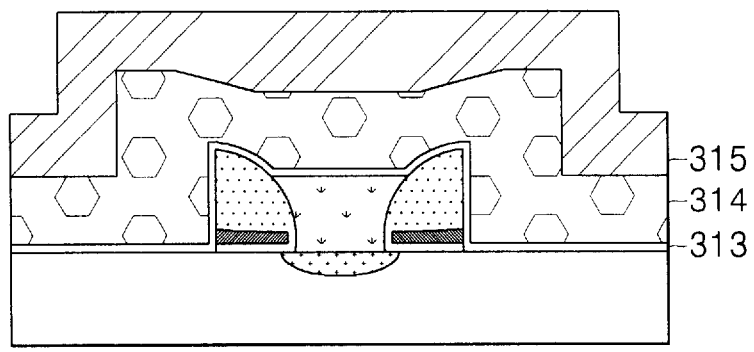
Figure 8H:
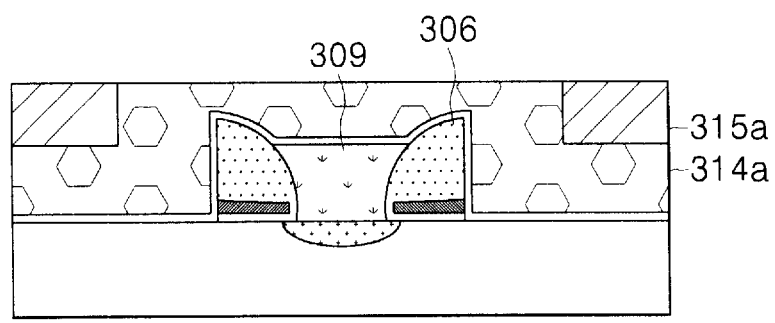
Figure 8I:
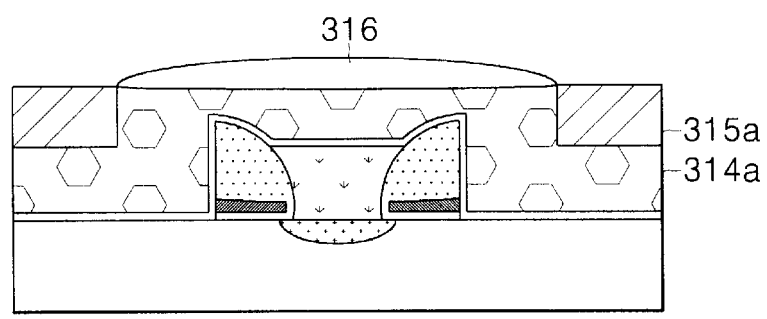
Figure 8J:
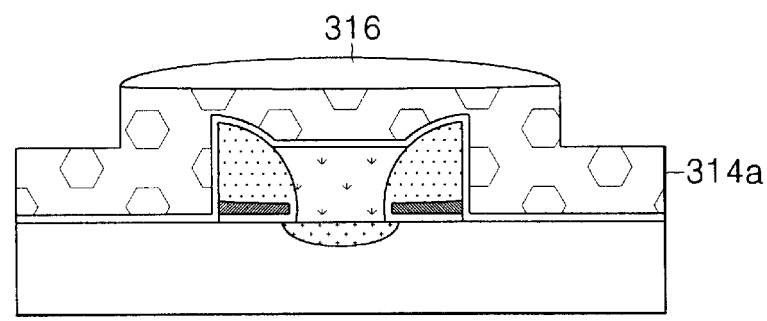
Figure 8K:
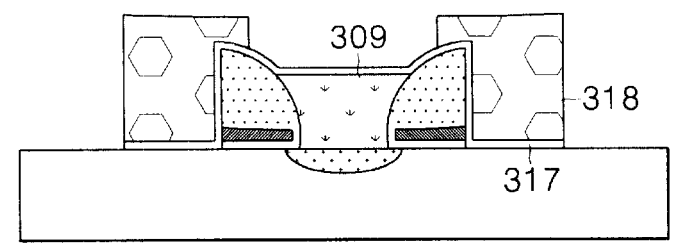
Figure 8L:
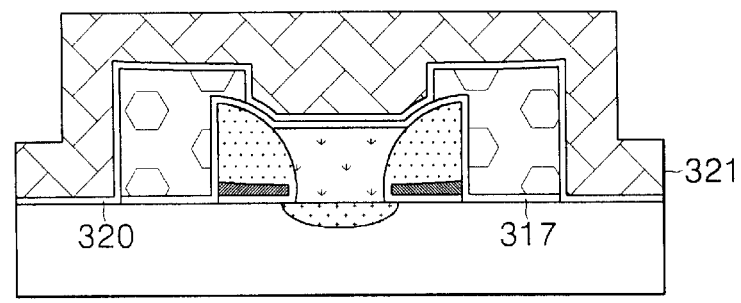
Figure 8M:
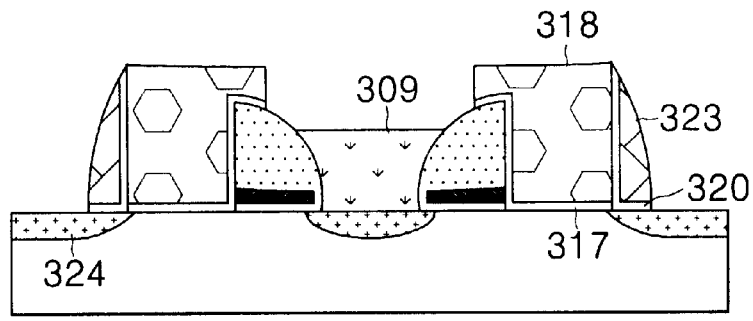
Figure 8N:
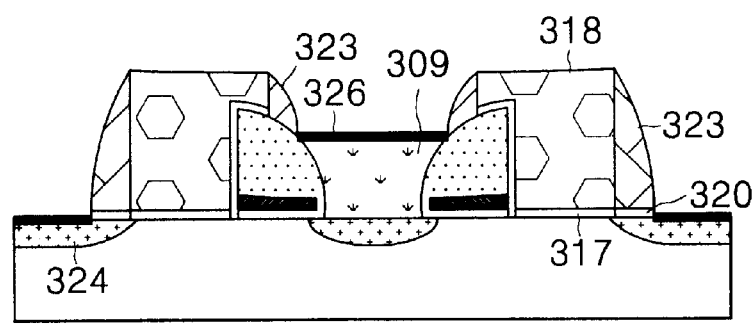
Figure 8O:
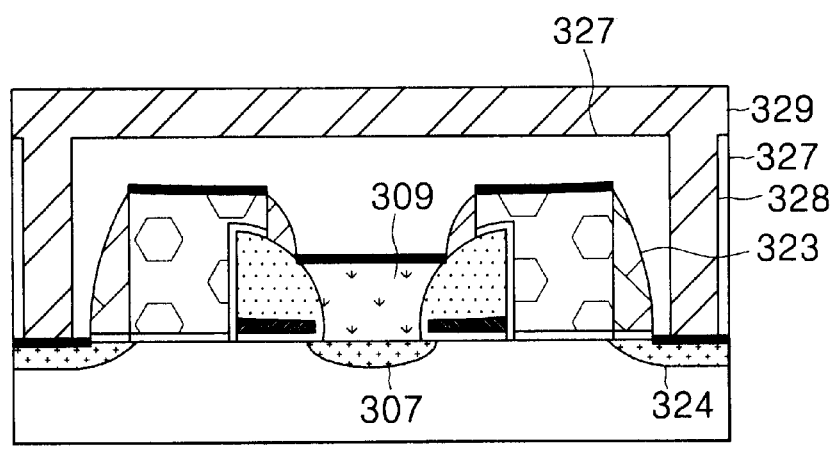
Figure 9A:
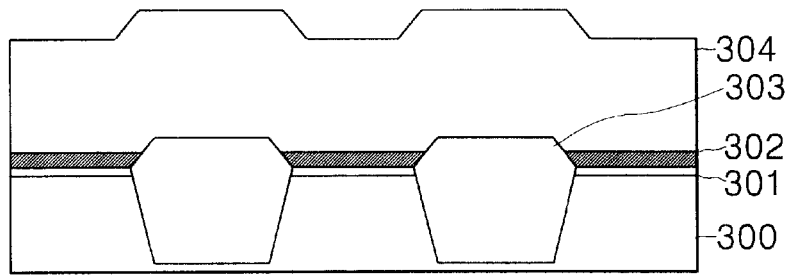
Figure 9B:
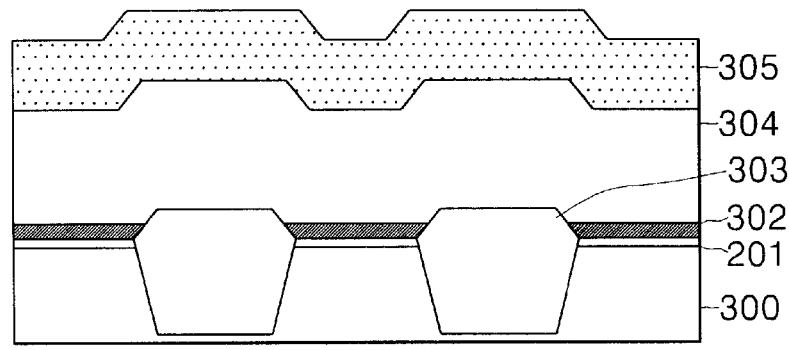
Figure 9C:
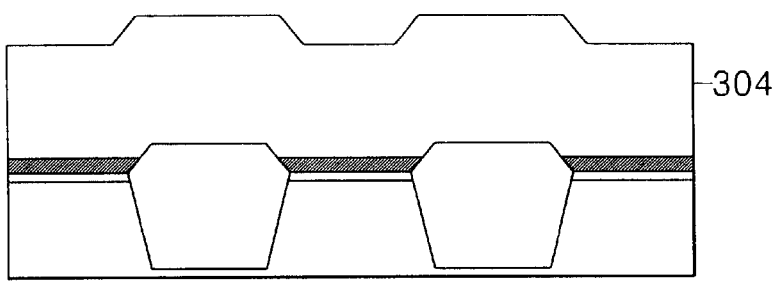
Figure 9D:
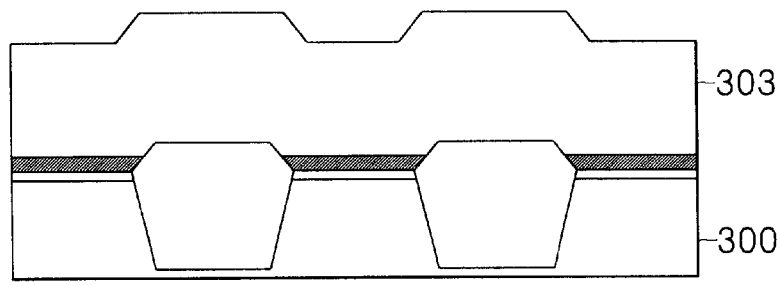
Figure 9E:
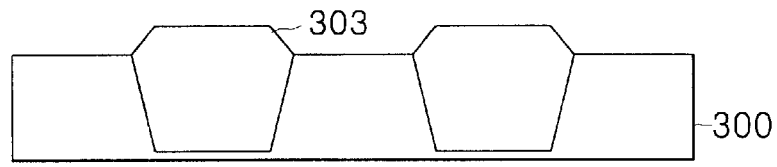
Figure 9F:
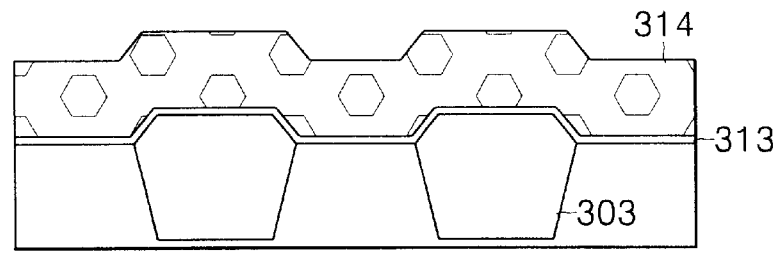
Figure 9G:
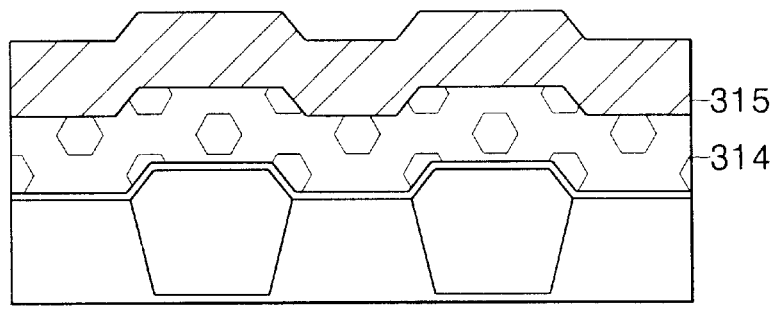
Figure 9H:
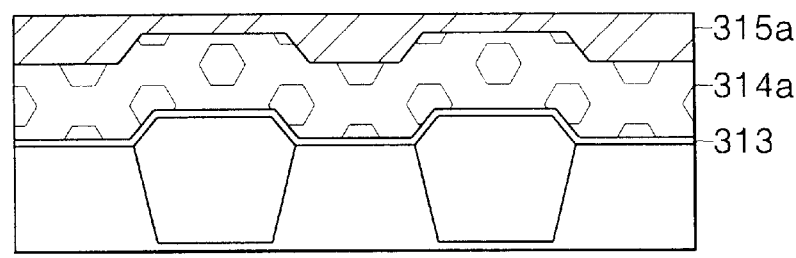
Figure 9I:
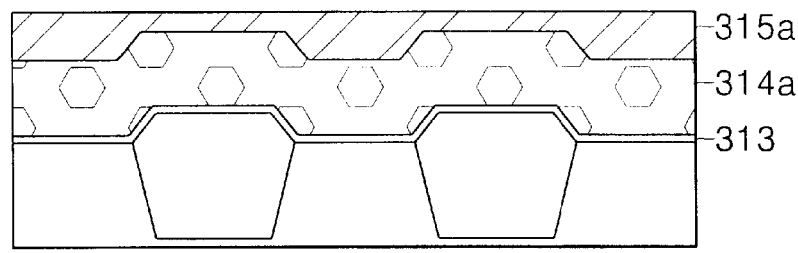
Figure 9J:
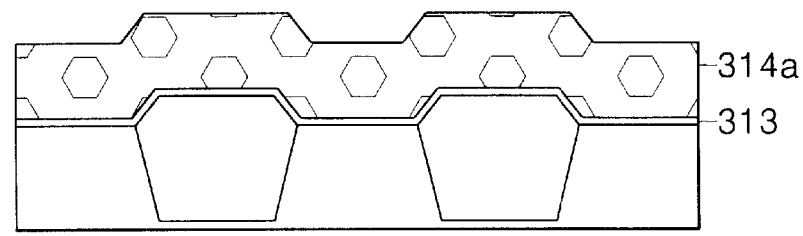
Figure 9K:
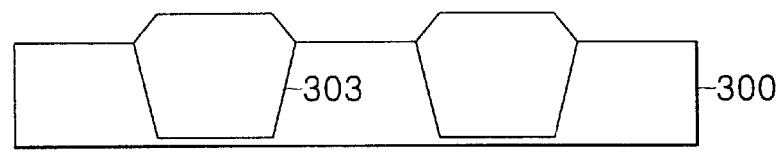
Figure 9L:
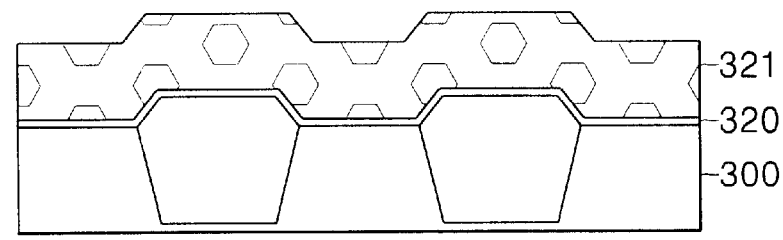
Figure 9M:
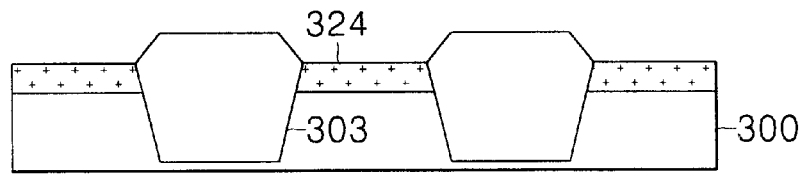
Figure 9N:
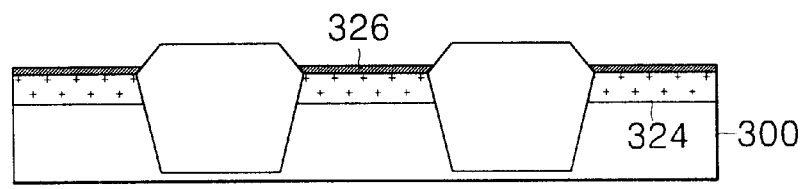
Figure 9O:
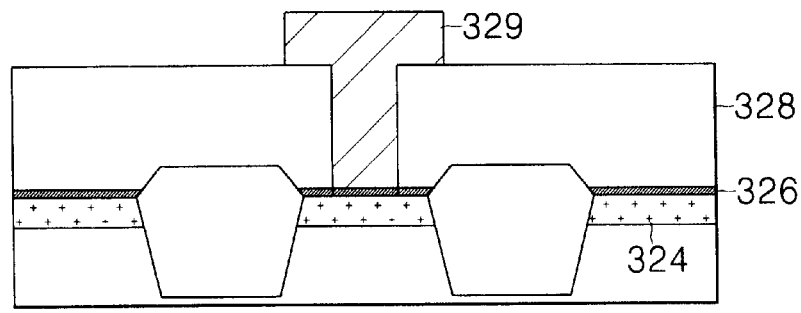

The split-gate flash memory according to the second preferred embodiment of the present invention has the same plain structure as that of FIG. 1, and FIG. 8A to 8O are cross-sectional views taken along line A–A' of FIG. 1, and FIGS. 9A to 9O are cross-sectional views taken along line B–B' of FIG. 1.

A process of FIGS. 8A to 8E and 9A to 9E is equal to that of FIGS. 6A to 6E and 7A to 7E, and thus their detailed explanation is omitted.

As shown in FIGS. 8A to 8E and 9A to 9E, a first gate insulating layer 310 is formed on a semiconductor substrate 300. The first gate insulating layer 310 is made of a first oxidation film 301. The floating gate 311 is formed on the first gate insulating layer 310. The floating gate 311 is made of a first conductive layer 302. The first conductive layer 302 comprises polycrystalline silicon. A spacer 306 is formed on the floating gate 311. The spacer 306 is made of a second oxidation film 305. A source junction region 307 is formed on a portion of the semiconductor substrate 300 between the floating gates 311, and a source line 309 is formed on the source junction region 307.

As shown in FIGS. 8F and 9F, a third oxidation film 313 and a second conductive layer 314 are sequentially deposited over the whole surface of the semiconductor substrate 300. The third oxidation film 313 is deposited through either of the CVD process or the thermal oxidation process.

As shown in FIGS. 8G and 9G, a nitride layer 315 is deposited on the second conductive layer 314.

As shown in FIGS. 8H and 9H, the second conductive layer 314 and the nitride layer 315 are simultaneously etched to a predetermined thickness through the CMP process to expose the second conductive layer 314, so that the array substrate is planarized.

As shown in FIGS. 8I and 9I, using the nitride layer 315a remaining after the CMP process as a mask, the exposed portion of the remaining third conductive layer 314a is oxidized to form a fourth oxidation film 316. Instead of the nitride layer 315, a SiON layer may be formed on the third conductive layer 314, and thereafter the CMP process may be performed.

As shown in FIGS. 8J and 9J, the nitride layer 314a is removed by a wet-etching technique. Then, using the fourth oxidation film 316 as a mask, a portion of the third conductive layer 314a and a portion of the second oxidation film 313 under the nitride layer 315a are etched.

Subsequently, as shown in FIGS. 8K and 9K, the fourth oxidation film 316 is removed, and thereafter the third oxidation film 313 and the third conductive layer 314a are simultaneously etched according to a photoresist pattern (not shown) to form a second gate insulating layer 317 and a word line 318. Therefore, like the word line 218 of FIG. 6K, the word line 318 of the split-gate flash memory according to the second preferred embodiment of the present invention has a vertical side wall. Also, the word line 318 overlaps an end portion of the first spacer 306.

As shown in FIGS. 8L and 9L, a fifth oxidation film 320 and a nitride layer 321 are sequentially deposited over the whole surface of the semiconductor substrate 300 and then are etched back to form a nitride spacer 323 (see FIG. 8M) on a side wall of the word line 318.

As shown in FIGS. 8M and 9M, impurities having the same conductivity as the source junction region 307 are ion-implanted into the exposed portion of the semiconductor substrate 300 to form a drain junction region 324.

Subsequently, as shown in FIGS. 8N and 9N, suicide layers 326 are formed on the exposed drain junction region 324, the source line 309 and the word line 318 through a silicidation process.

Finally, as shown FIGS. 8O and 9O, an interlayer insulator 327 is formed over the whole surface of the semiconductor substrate 300. The interlayer insulator 327 includes a contact hole 328 formed on a portion of the drain junction region 324. Then, a metal layer is deposited and patterned to a metal line 329. The metal line 329 contacts the drain junction region 324 through the contact hole 328. Therefore, the split-gate flash memory according to another preferred embodiment of the present invention is completed.

As described above, the split-gate flash memory according to the preferred embodiments of the present invention offers the following advantages. Since the word line has a vertical side wall and, therefore, uniform width, any reduction in area size of the word line is mitigated or eliminated, and thus any variance in resistance of the word line as a result of inconsistencies in the fabrication process can be prevented. Also, since the nitride spacer is formed only on a side wall of the word line, the nitride layer does not remain on the word line. Moreover, a short circuit between the drain junction region and the word line can be prevented due to the nitride spacer.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A split-gate flash memory, comprising:
   a first gate insulating layer formed on a semiconductor substrate;
   a floating gate formed on the first gate insulating layer;
   a first spacer surrounding the floating gate and having an outer side wall;
   a first junction region formed on a predetermined portion of the semiconductor substrate between two adjacent floating gates and having an opposite conductivity to that of the semiconductor substrate;
   a first conductive line formed on and in contact with the first junction region between two adjacent first spacers, wherein the first spacer insulates the floating gate from the conductive line;
   a second gate insulating layer formed on both a predetermined portion of the semiconductor substrate and the outer side wall of the first spacer;
   a word line formed on the second gate insulating layer, and having an inner side wall opposite the spacer side wall and an outer vertical side wall, the word line having a uniform width;
   a second spacer formed on the outer vertical side wall of the word line;
   a second junction region formed on a portion of the semiconductor substrate adjacent the second spacer and having the same conductivity as that of the first junction region;
   an interlayer insulator formed over the first spacer, word line, and second spacer, and having a contact hole, the contact hole formed on a portion of the second junction region; and
   a second conductive line formed on the interlayer insulator and contacting the second junction region through the contact hole.

2. The memory of claim 1, wherein the first and second junctions are a source junction region and a drain junction region, respectively.

3. The memory of claim 1, wherein the first and second conductive lines are a source line and a metal line, respectively.

4. The memory of claim 3, wherein the source line comprises polycrystalline silicon.

5. The memory of claim 1, wherein the first spacer is an oxidation film, and the second spacer is a nitride layer.

6. The memory of claim 1, further comprising a silicide layer formed on the first conductive line, the second junction region and the word line.

7. A split-gate flash memory, comprising:
- a first gate insulating layer formed on a semiconductor susbtrate;
- a floating gate formed on the first gate insulating layer;
- a first spacer surrounding the floating gate and having an outer side wall;
- a first junction region formed on a predetermined portion of the semiconductor substrate between two adjacent floating gates and having an opposite conductivity to that of the semiconductor substrate;
- a first conductive line formed on and in contact with the first junction region between two adjacent first spacers, wherein the first spacer insulates the floating gate from the conductive line;
- a second gate insulating layer formed on both a predetermined portion of the semiconductor substrate and the side wall of the first spacer;
- a word line formed on the second gate insulating layer, having an inner side wall and an outer vertical side wall and overlapping a top portion of the first spacer;
- a second spacer formed on the outer vertical side wall of the word line;
- a second junction region formed on a portion of the semiconductor substrate adjacent the second spacer and having the same conductivity as that of the first junction region;
- an interlayer insulator formed over the first spacer, the word line and the second junction region, and having a contact hole, the contact hole formed on a portion of the second junction region; and
- a second conductive line formed on the interlayer insulator and contacting the second junction region through the contact hole.

8. The memory of claim 7, wherein the first and second junctions are a source junction region and a drain junction region, respectively.

9. The memory of claim 7, wherein the first and second conductive lines are a source line and a metal line, respectively.

10. The memory of claim 9, wherein the source line comprises polycrystalline silicon.

11. The memory of claim 7, wherein the first spacer is an oxidation film, and the second spacer is a nitride layer.

12. The memory of claim 7, further comprising, a silicide layer formed on the first conductive line, the second junction region and the word line.

13. The memory of claim 7, wherein the second gate insulating layer overlaps a top end portion of the first spacer.

14. The memory of claim 13, further comprising a silicide layer formed on the first conductive line, the second junction region and the word line.

* * * * *